United States Patent [19]
Blish, II et al.

[11] Patent Number: 6,043,429
[45] Date of Patent: *Mar. 28, 2000

[54] METHOD OF MAKING FLIP CHIP PACKAGES

[75] Inventors: Richard C. Blish, II, Saratoga; Frank Ruttenberg, Campbell, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/854,103

[22] Filed: May 8, 1997

[51] Int. Cl.[7] .................................................... H05K 9/00
[52] U.S. Cl. ..................... 174/35 R; 174/52.4; 174/52.2; 257/659; 257/778; 257/737
[58] Field of Search .................................. 174/52.2, 52.3, 174/52.4, 35 R; 257/736, 737, 738, 779, 780, 781, 778, 659, 660; 361/816, 818

[56] References Cited

U.S. PATENT DOCUMENTS

| | | | |
|---|---|---|---|
| 5,075,965 | 12/1991 | Carey et al. | 29/840 |
| 5,468,995 | 11/1995 | Higgins, III | 257/697 |
| 5,477,087 | 12/1995 | Kawakita et al. | 257/737 |
| 5,550,427 | 8/1996 | Hayashi | 313/355 |
| 5,668,410 | 9/1997 | Yamamoto | 29/43 |

OTHER PUBLICATIONS

"Thick Film Technology and Chip Joining", pp. 100–153, Lewis F. Miller, International Business Machines Corporation, 1972. No Month.

"Flip Chip Technologies", pp. 24–83 and 415–491, John H. Lau, 1995. No Month.

*Primary Examiner*—Kristine Kincaid
*Assistant Examiner*—Hung V Ngo
*Attorney, Agent, or Firm*—LaRiviere, Grubman & Payne, LLP

[57] ABSTRACT

A flip chip and a flip chip package are shielded from alpha particles emitted by lead in the solder bumps used to form the electrical connection between the flip chip and a substrate. This is accomplished by coating the solder bumps with a layer of alpha particle absorbing material or by providing a suitable amount of alpha particle absorbing material in the underfill material between the flip chip and the substrate. Methods of forming the coating the solder bumps include electroless coating, as well as a method involving a) the deposition of a layer of thick resist in a pattern suitable for the formation of solder bumps; b) the deposition of a layer of alpha particle absorbing material; c) the deposition of a layer of solder; d) removal of excess solder and alpha particle absorbing material; and e) the removal of the thick resist layer.

10 Claims, 4 Drawing Sheets

METHOD OF MAKING FLIP CHIP PACKAGES

TECHNICAL FIELD

The present invention relates to a method of making integrated circuits known as flip chips, and to a method of attaching flip chips to a substrate, typically a printed circuit board. The invention also includes a flip chip which has a unique structure resulting from the method of manufacture.

BACKGROUND OF THE INVENTION

A flip chip is generally defined as a chip mounted on a substrate by various interconnect materials and methods, which is characterized in that the active input-output area of the chip surface faces the substrate.

The classic flip chip technology is the IBM Controlled-Collapse Chip Connection (C4). This technology utilizes solder bumps deposited on solder wettable metal terminals on the chip and a matching footprint of solder wettable terminals on the substrate. The solder typically includes approximately 95% to 97% by weight of lead (Pb), with the remainder being made up by tin (Sn).

When mounting the chip to the substrate, the substrate is first prepared with solder flux and the chip is "flipped" onto the substrate with the solder bumps aligned with the substrate terminals. All of the solder joints are then formed simultaneously by reflowing (melting) the solder to achieve electrical connection. Residual flux is then removed using an appropriate solvent.

An underfill, or alternatively, an encapsulant material is then applied to the chip, and by capillary action, the space between the chip and the substrate is filled substantially completely by the underfill or encapsulant material. The chip and the substrate are then firmly bonded by curing the underfill or encapsulant material. The problem of large thermal mismatch between the chip and the substrate, which would otherwise cause solder fatigue problems, is reduced by an order of magnitude by the use of the underfill material or encapsulant between the flip chip and the substrate.

SUMMARY OF THE INVENTION

Applicants have determined that alpha particles which are emitted by the $Pb^{210}$ isotope, or other alpha emitters such as $U^{235}$, $U^{238}$ (uranium) or $Th^{232}$ (thorium) isotopes, which are present in the solder bump, are available to deposit charge on "floating" nodes in the chip, or on sensitive silicon (Si) integrated circuit (IC) junctions or capacitances (parasitic or deliberate), changing IC device states in a non-destructive manner. This unwanted charge deposition creates so called "soft" errors in the operation of the chip. This is also known in the art as a "single event upset".

For example, a single alpha particle passing through silicon loses energy by creating electron-hole pairs in the silicon. An electron-hole pair is created when an electron is displaced from its atom to another location, leaving behind a region with a net positive charge, known in the art as a "hole". Each electron-hole pair in Si requires 3.3 eV for its creation, with the result that a single alpha particle which has an energy of 5 MeV has the potential of creating 150,000 electron-hole pairs. If these electron-hole pairs are created in an insensitive area of the semiconductor device, they will gradually recombine without any adverse effects. However, if the alpha particle passes through a sensitive area, for example, a region of high electric field such as a depletion layer in a p-n junction, the generation of the electron-hole pairs can either charge or discharge the p-n junction, resulting in a change of state of the p-n junction from a 0 to a 1 or vice versa. Such an error is known as a "soft" error, as the semiconductor device is returnable to its original configuration Accordingly, the invention provides a method of making a flip chip package, and a flip chip package in which sensitive Si junctions and floating nodes in the package are shielded from exposure to energetic alpha particles emitted by the solder bumps.

This is done by providing alpha particle absorbing material between the solder bumps and the sensitive devices, preferably by surrounding the solder bump with alpha particle absorbing material.

In a first embodiment of the invention, a suitable alpha particle absorbing material is included in the underfill or encapsulant material. Conventional underfill materials are epoxies loaded with silica, but neither epoxies nor silica are particularly effective alpha particle absorbers. Accordingly, the shielding of the sensitive junctions and nodes is accomplished in the first embodiment of the invention by including an elemental metallic absorber, provided with an insulating coating, in the underfill material. Alternatively, in the first embodiment of the invention, a heavy metal oxide or a heavy metal nitride could be included in the underfill material to absorb the alpha particles.

Alternatively, a suitable material can be deposited on the exterior surface of the solder bump after joining of the chip to the substrate.

Further, the exterior surface of the solder bump can be coated with a suitable alpha absorbing material prior to chip join.

By providing a flip chip package which is shielded from alpha particles in this manner, the logical operation of the chip is more reliable.

Other features of the invention are disclosed or apparent in the section entitled "BEST MODE OF CARRYING OUT THE INVENTION"

BRIEF DESCRIPTION OF THE DRAWINGS

For fuller understanding of the present invention, reference is made to the accompanying drawings in the following detailed description of the Best Mode of Carrying Out the Invention. In the drawings.

BEST MODE OF CARRYING OUT THE INVENTION

As flip chips and semiconductor manufacturing techniques are well known in the art, in order to avoid confusion, while enabling those skilled in the art to practice the claimed invention, this specification omits many details with respect to known items.

Figure 1:
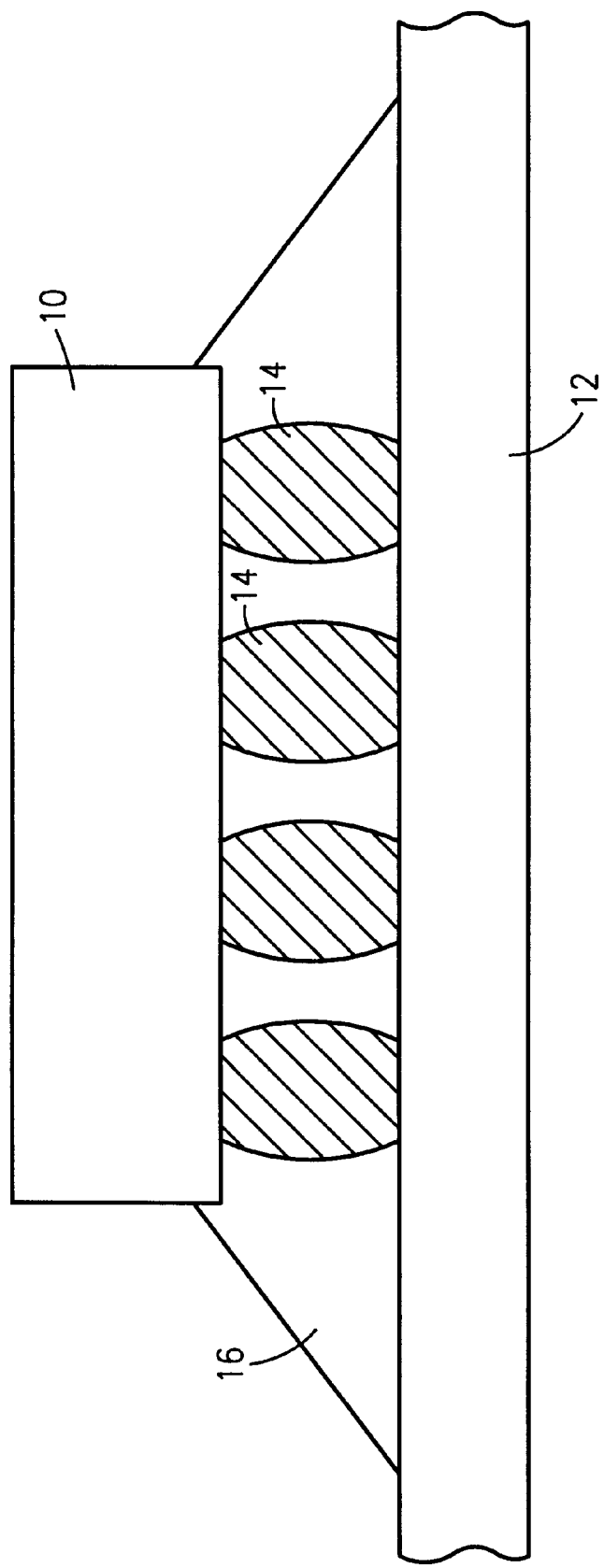
FIG. 1 is a longitudinal cross-sectional view of a chip mounted to a substrate in a first embodiment of the invention.

FIG. 1 shows a flip chip 10 mounted to a substrate 12. Electrical connection between the terminals on chip 10 and the terminals on the substrate 12 is effected by means of solder bumps 14. Surrounding the solder bumps 14 between the chip 10 and the substrate 12 is an epoxy underfill 16 which serves to improve the physical connection between the chip 10 and the substrate 14, and perhaps more importantly, serves to bear the bulk of the forces resulting from differing expansion rates of the chip 10 and substrate 12 under thermal loading.

Included in the epoxy underfill 16 is a material which is an effective alpha particle absorber, in this case either a heavy metal elemental absorber, a heavy metal oxide, or a heavy metal nitride. The alpha particle absorbing material is added to the uncured underfill in powder form, and is included in a maximum amount which can included in the underfill without adversely affecting the viscosity of the uncured underfill. The desired viscosity of the uncured underfill is a limiting factor because, after chip join to the substrate 12, the underfill is injected under one or two edges of the chip 10, and flows under the chip 10 by means of capillary action. Accordingly, if too much of the alpha particle absorbing material is included in the underfill 16, the underfill will not flow satisfactorily between the chip 10 and the substrate 12.

In the illustrated embodiment, the alpha particle absorbing material is between 0 and 80% by weight of the underfill, or between 0 and 50% by volume of the underfill. More preferably, the alpha particle absorbing material is between 20 and 60% by weight of the underfill, or between 10 and 30% by volume of the underfill.

In the case of a heavy metal element, to prevent electrical shorts from occurring between solder bumps, the heavy metal is provided with a non-conducting outer layer, preferably an oxide of the metal itself.

In order to understand the choice of particular materials which are suitable for use as an alpha particle absorber in the underfill material, it is instructive to note that the penetration range of an alpha particle into an elemental absorber varies empirically as:

$$\text{Range} = 6\,\mu m * E^{1.5} * Z^{-0.45} / \rho \quad \text{Equation (1)}$$

where E is the energy of the alpha particle in MeV, Z is the atomic number of the element, and $\rho$ is the density in g/cm$^3$; while the range of an alpha particle into an elemental oxide absorber varies as:

$$\text{Range} = 95\,\mu m * E^{1.5} * Z^{-0.68} / \rho \quad \text{Equation (2)},$$

with the same symbols and units as Equation (1).

From Equation 1, the following table of suitable elemental alpha particle absorbing materials can be generated:

TABLE 1

| Element | Density (g/cm$^3$) | Z | Range for corresponding alpha particle energy ($\mu$m) | | |
|---|---|---|---|---|---|
| | | | 2 MeV | 5 MeV | 10 MeV |
| Ti | 4.5 | 22 | 6 | 17 | 48 |
| Ni | 8.9 | 28 | 4 | 11 | 27 |
| Cu | 8.9 | 29 | 5 | 11 | 30 |

TABLE 1-continued

| Element | Density (g/cm$^3$) | Z | Range for corresponding alpha particle energy ($\mu$m) | | |
|---|---|---|---|---|---|
| | | | 2 MeV | 5 MeV | 10 MeV |
| Zn | 7.14 | 30 | 6 | 15 | 36 |
| Sn | 7.28 | 50 | 6 | 17 | 45 |
| Ta | 16.6 | 73 | 5 | 11 | 27 |
| Pt | 21.45 | 78 | 3.5 | 9 | 23 |
| Pb | 11.3 | 82 | 6 | 17 | 40 |

By way of comparison, the following table gives the corresponding values for epoxy, silicon, aluminum and amorphous carbon:

TABLE 2

| Material | Density | Z | Range for corresponding alpha particle energy ($\mu$m): | | |
|---|---|---|---|---|---|
| | | | 2 MeV | 5 MeV | 10 MeV |
| CH$_2$ (epoxy) | 1.12 | 6,1 | 5 | 17 | 52 |
| C(amorph) | 1.95 | 6 | 8 | 25 | 70 |
| Al | 2.7 | 13 | 7 | 25 | 68 |
| Si | 2.33 | 14 | 8 | 27 | 75 |

Accordingly, it can be seen from Table 1 that, while all of the listed metals provide a reduced penetration range of alpha particles compared to the epoxy or the silicon in the chip, or aluminum, which is found in the multilevel semiconductor metallization system, the preferred elemental absorbers are nickel, copper, zinc, platinum or lead. The lead of course will have to be a purified or "cold" lead isotopes, e.g. Pb$^{206}$, Pb$^{207}$ or Pb$^{208}$, to ensure that the intended alpha absorber itself does not emit alpha particles.

From Equation (2), the following table of suitable elemental oxide alpha particle absorbing materials can be generated:

TABLE 3

| Oxide | Density (g/cm$^3$) | Z (Element) | Range for corresponding alpha particle energy ($\mu$m) | | |
|---|---|---|---|---|---|
| | | | 2 MeV | 5 MeV | 10 MeV |
| TiO$_2$ | 4.0 | 22 | 5 | 15 | 40 |
| ZnO | 5.47 | 30 | 4.5 | 13 | 35 |
| SnO$_2$ | 6.95 | 50 | 3 | 9 | 26 |
| Ta$_2$O$_2$ | 8.73 | 73 | 2.5 | 7.7 | 20 |

By way of comparison, silicon dioxide, SiO$_2$, which is commonly used as a passivation layer in a chip, with a density of 2.3, has penetration ranges of 8, 24 and 66 $\mu$m for alpha particle energies of 2, 5 and 10 MeV respectively.

The alpha particle absorbing material in the underfill may also be a metal nitride, for example TiN, TaN.

The desired amount of alpha particle absorbing material in the underfill can also be determined with by using Equations (1) and (2) and an estimate of the distance an alpha particle will travel though the underfill. For example, if the pitch distance between solder bumps is taken as the estimated distance that an alpha particle will travel through the underfill, for example 50 $\mu$m, and, noting from Equation (1) that 12 $\mu$m of nickel will absorb a 5 MeV alpha particle, then in order to provide approximately 12 $\mu$m of nickel in 50 $\mu$m of underfill, 24% by volume of nickel will be required in the underfill.

FIGS. 2(a–d) are diagrams illustrating a method of shielding the sensitive areas of a flip chip package from alpha particles, and a flip chip package incorporating such shielding according to a second embodiment of the invention.

Figure 2A:
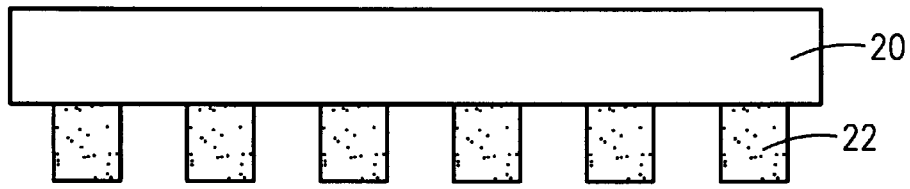
FIGS. 2(a–d) are diagrams illustrating a method of shielding the sensitive areas of a flip chip package from alpha particles, and a flip chip package incorporating such shielding, according to a second embodiment of the invention.

A flip chip 20 with solder bumps 22 is illustrated in FIG. 2(a). The solder bumps 22 are formed in a conventional manner on chip 20, and are used to provide electrical contact between the terminals of the chip 20 and the terminals on a substrate.

Figure 2B:
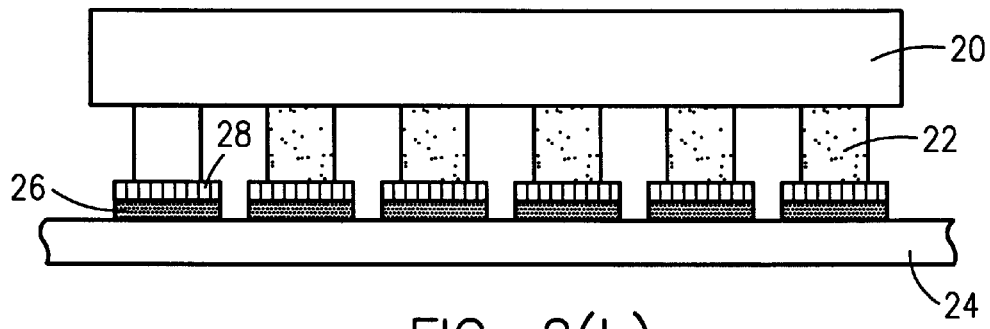

In FIG. 2(b), the chip 20 is shown positioned over a substrate 24 with the solder bumps 22 aligned with terminals 26 on the substrate 24. Flux 28 has previously been applied to the terminals 26 in preparation for chip join to the substrate 24.

Figure 2C:
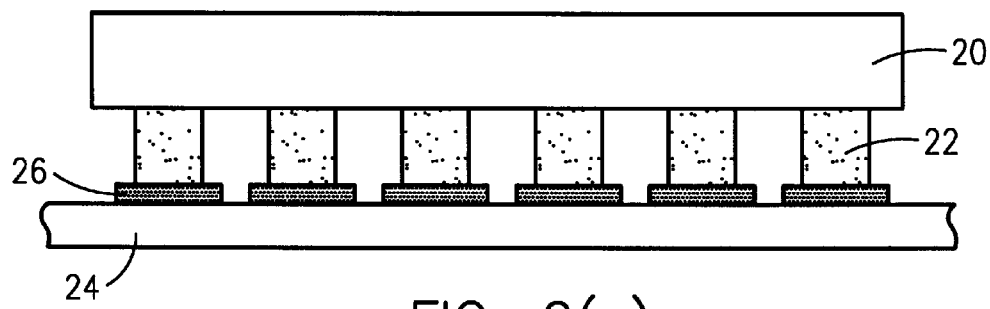

The solder bumps 22 are then reflowed by heating the solder bumps 22 to a temperature above the melting point of the solder. When the solder bumps 22 melt, they form a metallurgical bond with the with the terminal 26 material, to provide the electrical connection between the substrate 24 and the chip 20. This is shown in FIG. 2(c).

After chip join, the outer surfaces of the solder bumps 22 are coated with a 12 $\mu$m thick coating 30 of nickel. This is done by immersing the chip 20 and the solder bumps 22 in a conventional electroless nickel plating solution. The temperature of the electroless nickel plating solution and the duration of the immersion of the solder bumps 22 in the solution will be determined by from the specifications provided by the manufacturer of the solution. In this case, the immersion time will be selected to provide a thickness of the nickel coating 30 of 12 $\mu$m, which is sufficient to absorb an 5 MeV alpha particle leaving the solder bump.

Figure 2D:
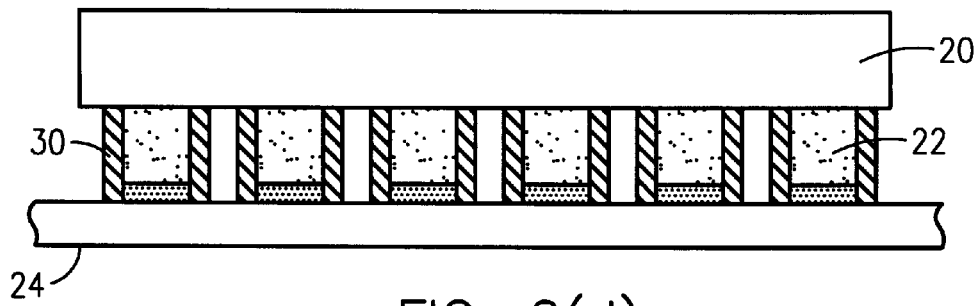

The resulting flip package structure, which is illustrated in FIG. 2(d), significantly reduces the number of alpha particles exiting the solder bump 22 in a direction which is generally parallel to the substrate 24. Alpha particles which exit the solder bump 22 in this direction are particularly prone to causing soft errors, due to the shallow angle, and hence the long projected distance, that the alpha particle will pass through the chip 20 or the substrate 24. However, the configuration illustrated in FIG. 2(d) has the disadvantage that the chip 20 is not shielded from alpha particles exiting from the upper surface of the solder bump 22.

FIGS. 3(a–e) illustrates the best mode embodiment of a method of forming a flip chip according to the invention, and the resulting best mode embodiment of the flip chip structure.

Figure 3A:
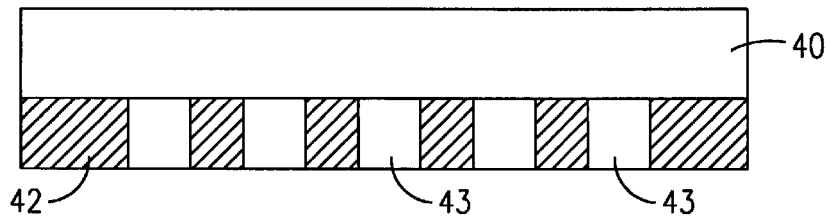
FIGS. 3(a–e) are diagrams illustrating the best mode embodiment of a method of shielding the sensitive areas of a flip chip package from alpha particles, and a flip chip incorporating such shielding.

FIGS. 3(a) illustrates a flip chip 40 without solder bumps formed thereon yet. In the first step of the process, a thick resist 42 is applied to the chip 40. The thick resist 42 is deposited to the thickness equal to the height of a prospective solder bump, and is applied in a pattern which defines recesses 43 into which solder is to be deposited in the subsequent formation of the solder bumps.

The resist 42 is a conventional photoresist, and is applied to the lower surface of the chip 40 as follows: Firstly, the entire lower surface of the chip 40 is covered with photoresist. Secondly, the photoresist is selectively exposed to light using a photomask. Thirdly, the exposed photoresist (or the unexposed photoresist, depending on the particular type of photoresist used) is removed using an appropriate solvent. This leaves the structure illustrated in FIG. 3(a).

Figure 3B:
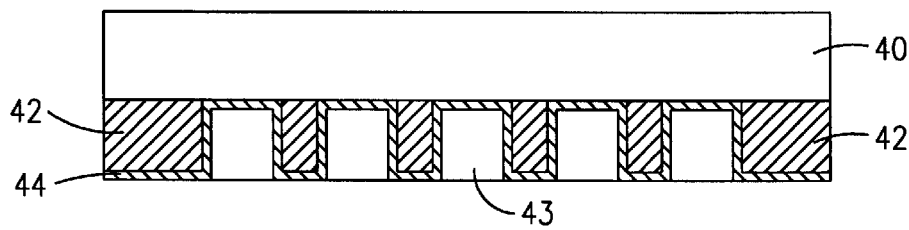

As illustrated in FIG. 3(b), the lower surface of the chip 40, including the thick resist 42, is then covered with a conductive, alpha particle absorbing material. In particular, the alpha particle absorbing material is deposited on the surfaces of the thick resist which defines the recesses 43, and on the exposed surface of the chip 40.

In the illustrated embodiment, the alpha particle absorbing material is nickel which is sputtered or evaporated onto the chip 40 and resist 42 to form a layer 44 which has a thickness of at least 12 $\mu$m.

Figure 3C:
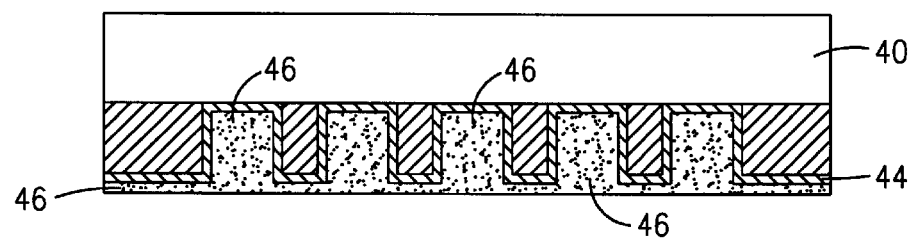

As shown in FIG. 3(c), a layer of solder 46 is then electroplated over the nickel layer 44 in an amount sufficient to fill the recesses 43 defined by the nickel layer 44 and the resist 42.

Figure 3D:
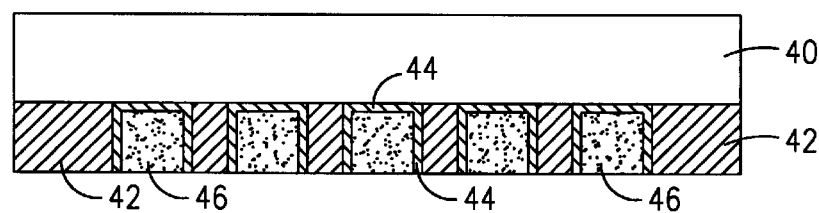

Excess solder 46 and excess nickel 44 are then removed using chemical-mechanical polishing. The chemical-mechanical polishing is done down to a level where the thick resist 42 is again exposed. This process and the resulting structure is illustrated in FIG. 3(d).

Figure 3E:
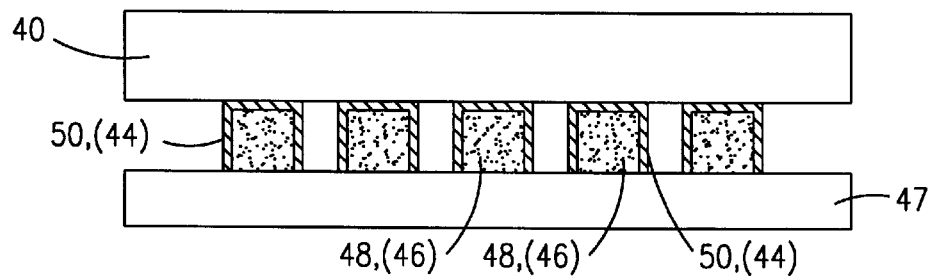

The thick resist 42 is then removed using an appropriate solvent, which results in the structure illustrated in FIG. 3(e). As can be seen from the figure, the chip 40 is now provided with solder bumps 48 which are encased on their outer and upper surfaces with an alpha particle absorbing material, in this case, the nickel layer 50.

It will be appreciated that the chip 40 in this embodiment is shielded from alpha particles emitted from the top of the solder bump 48 as well as from alpha particles emitted from the sides of the solder bump 48.

At this point, the chip is join to the substrate 47 with a process similar to the process as described with reference to FIGS. 2(a) to (c).

FIG. 4(a–e) illustrates a fourth embodiment of a method of shielding the sensitive areas of a flip chip package from alpha particles, and a flip chip package incorporating such shielding.

The initial steps of the process in this embodiment proceed as described above with reference to FIGS. 3(a) to (e), with the exception that tantalum is applied to shield the solder bumps instead of nickel.

Figure 4A:
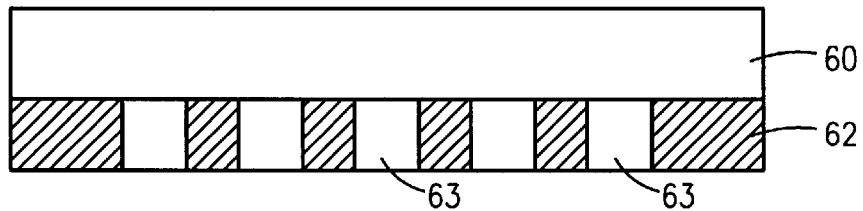
FIGS. 4(a–e) are diagrams illustrating the a fourth embodiment of a method of shielding the sensitive areas of a flip chip package from alpha particles, and a flip chip incorporating such shielding.

As can be seen in FIG. 4(a), a layer of thick resist 62 is applied to the lower surface of the chip 60 as described previously with reference to FIG. 3(a). As before, the thick resist 62 is deposited to the thickness equal to the height of a solder bump, and is applied in a pattern which defines recesses 63 into which solder is to be deposited in the subsequent formation of the solder bumps.

Figure 4B:
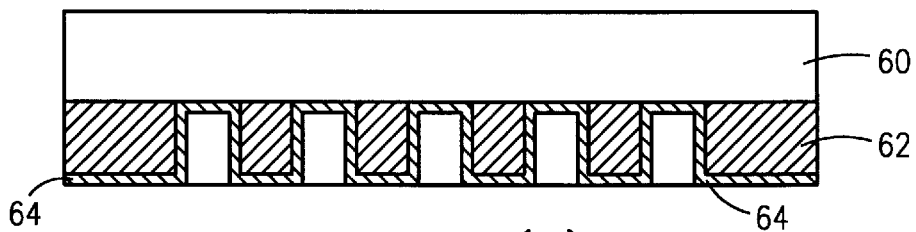

A layer of tantalum 64 is then deposited on the surfaces of the thick resist which defines the recesses 63, and on the exposed surface of the chip 60, by means of a sputtering or evaporation process. The resulting structure is illustrated in FIG. 4(b).

Figure 4C:
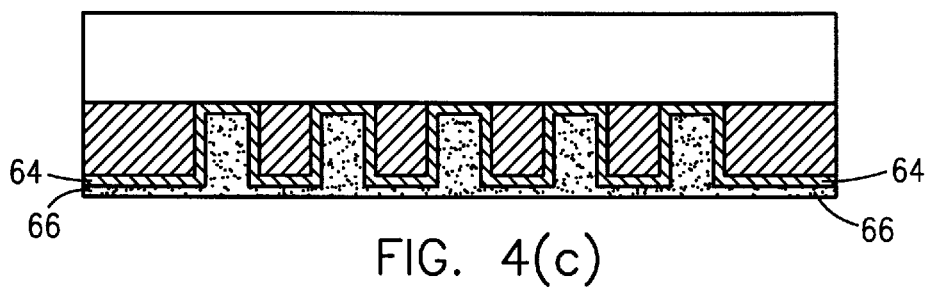

In FIG. 4(c), a layer of solder 66 is then applied to the tantalum layer 64 to a sufficient depth to fill the recesses 63 defined by the thick resist 62 and the tantalum layer 64. Excess solder 66 and excess tantalum 64 are then removed using chemical-mechanical polishing as before. The chemical-mechanical polishing is done to a sufficient depth to expose the resist 62. The resist 62 is then removed using an appropriate solvent.

Chip join to the substrate then proceeds as described above with reference to FIGS. 2(a) to (c). As before, the solder bumps 70 provide an electrical connection between the terminals of the flip chip 60 and the terminals 72 of the substrate 68.

Figure 4D:
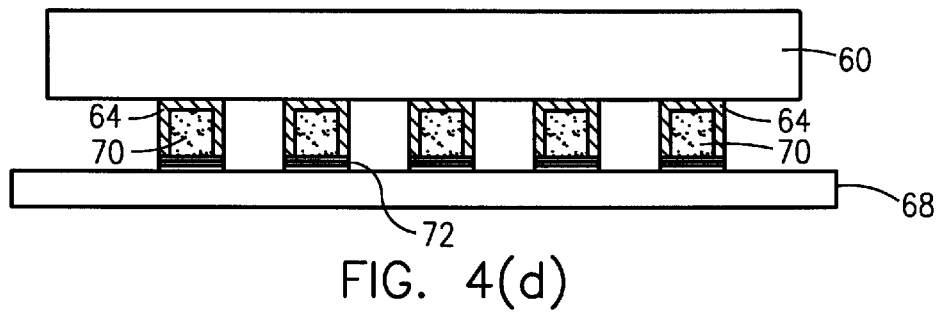

As illustrated in FIG. 4(d), the chip 60 now has solder bumps 70 which are encased in an alpha particle absorbing layer of tantalum 64.

After chip join, the tantalum layer around the sides of the solder bumps 70 is oxidized to provide a layer of tantalum oxide 78 surrounding each solder bump 70. This is accomplished by shorting out the input/output pins 74 of the substrate (not shown in FIGS. 4(a) to (d)) using a shorting bar 76, and inverting the flip chip 60 and the solder bumps 70 into a basic oxidizing solution. A voltage sufficient to cause oxidation of the tantalum is then applied to the shorting bar 76, and hence to the solder bumps 70. The immersion time required to oxidize the layer of tantalum, and the voltage required to be applied to the shorting bar 76 will be determined by the specifications provided by the manufacturer of the anodizing solution.

Figure 4E:
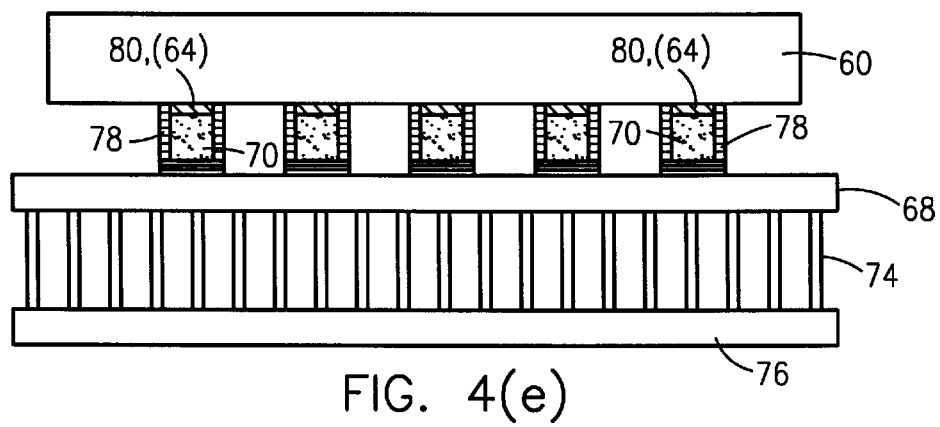

The resulting flip chip package, illustrated in FIG. 4(e), has solder bumps 70 which are encased in tantalum oxide 78 on their side surfaces, with a layer of tantalum 80 on the upper surface of the solder bumps 70. Accordingly, the chip 60 is shielded both from alpha particles exiting the solder bump 70 substantially parallel to the chip 60, and also from alpha particles emitted directly upwards from the solder bump 70. The reason for oxidizing the outer surface of the tantalum will be appreciated by comparing Tables 1 and 3 above, where it can be seen that tantalum oxide provides better shielding properties than elemental tantalum. To ensure sufficient shielding from alpha particles emitted from the top of each solder bump 70, the layer of tantalum 80 is approximately 11 microns thick and the layer of tantalum oxide 78 will be approximately twice as thick, due to the volume change during oxidization.

It will be appreciated that many modifications can be made to the embodiments described above without departing from the spirit and the scope of the invention.

What is claimed is:

1. A flip chip semiconductor device having alpha particle shielding structure, said device comprising:
    a chip member having an active input-output surface area, said area provided with a plurality of metal chip terminals;
    a substrate member having a plurality of metal substrate terminals;
    a plurality of solder bump structures for providing electrical contact between said chip member and said substrate member; and
    a plurality of encasements made of alpha particle absorbing material, wherein each encasement surrounds at least one of said solder bump structures and substantially extends along the solder bump structure from the chip member to the substrate member.

2. The semiconductor device as described in claim 1, wherein the plurality of encasements are joined together in a single piece of underfill material.

3. The semiconductor device as described in claim 2, wherein the underfill material comprises:
    an alpha particle absorbing material in particulate form; and
    a non conducting material for suspending the alpha particle absorbing material.

4. The semiconductor device as described in claim 1, wherein
    each solder bump structure having an upper surface fabricated in electrical contact with a respective one of said plurality of metal chip terminals, and
    during operation of said chip member, each encasement shields said chip member from alpha particles emitted from said solder bump structures.

5. The semiconductor device according to claim 4, wherein:
    said alpha particle absorbing material is selected from a group consisting of metals and metal oxides.

6. The semiconductor device according to claim 5 wherein:
    said alpha particle absorbing material having a thickness sufficient to absorb a 5 MeV alpha particle emitted from each said solder bump structure.

7. The semiconductor device as described in claim 1, wherein
    each encasement having an upper portion fabricated in electrical contact with a respective one of said plurality of metal chip terminals, and
    during operation of said chip member, each encasement shields said chip member from alpha particles emitted from said solder bump structures.

8. The semiconductor device according to claim 7 wherein:
    said alpha particle absorbing material is selected from a group consisting of metals and metal oxides.

9. The semiconductor device according to claim 8, wherein: said alpha particle absorbing material having a thickness sufficient to absorb a 5 MeV alpha particle emitted from each said solder bump structure.

10. The semiconductor device as described in claim 1, wherein each of the solder bump structures is solid solder.

* * * * *